US008421480B2

(12) United States Patent
Ando

(10) Patent No.: US 8,421,480 B2
(45) Date of Patent: Apr. 16, 2013

(54) MULTIDIRECTIONAL SWITCH MEMBER AND ELECTRONIC DEVICE HAVING SAME

(75) Inventor: Hitoshi Ando, Saitama (JP)

(73) Assignee: Shin-Etsu Polymer Co., Ltd. (JP)

( * ) Notice: Subject to any disclaimer, the term of this patent is extended or adjusted under 35 U.S.C. 154(b) by 329 days.

(21) Appl. No.: 12/894,753

(22) Filed: Sep. 30, 2010

(65) Prior Publication Data

US 2011/0080179 A1 Apr. 7, 2011

(30) Foreign Application Priority Data

Oct. 5, 2009 (JP) ................................ 2009-231250

(51) Int. Cl.
*G01R 27/28* (2006.01)
*H01H 9/00* (2006.01)

(52) U.S. Cl.
USPC ............ 324/649; 338/47; 324/658; 324/686; 324/688

(58) Field of Classification Search .................. 324/649, 324/658–690; 345/156, 143, 146, 173–178; 200/345
See application file for complete search history.

(56) References Cited

U.S. PATENT DOCUMENTS 6,067,005 A * 5/2000 DeVolpi .......................... 338/47
6,087,925 A * 7/2000 DeVolpi .......................... 338/92
6,313,731 B1 * 11/2001 Vance .......................... 338/185
7,123,028 B2 * 10/2006 Okada et al. .................. 324/681
7,176,889 B2 * 2/2007 Baker et al. ................... 345/156
8,334,159 B1 * 12/2012 Fu .................................. 438/53
2004/0056669 A1 * 3/2004 Morimoto ..................... 324/691
2005/0007341 A1 * 1/2005 Inoue et al. ................... 345/156
2005/0224321 A1 * 10/2005 Yamasaki ..................... 200/6 A
2007/0278082 A1 * 12/2007 Parkinson ..................... 200/512
2008/0191715 A1 * 8/2008 Schediwy et al. ............ 324/663
2011/0309908 A1 * 12/2011 Ando et al. ..................... 338/47

FOREIGN PATENT DOCUMENTS

JP 2003-083819 A 3/2003

* cited by examiner

*Primary Examiner* — Joshua Benitez Rosario
*Assistant Examiner* — Adam Clarke
(74) *Attorney, Agent, or Firm* — Harness, Dickey & Pierce, P.L.C.

(57) ABSTRACT

A multidirectional switch member and an electronic device includes an operation plate in which a pressing operation may be performed in a plurality of directions including four standard directions and a median direction extending between the four standard directions, a PCB that is located at the back side of the operation plate, a plurality of conductive bodies that are provided on the back side of the operation plate, a group of standard direction contact electrodes that each have a first electrode and a first ground potential electrode along each of the standard directions, and a group of median direction contact electrodes that have two of a second electrode and a second ground potential electrode along the median direction, wherein the two second electrodes and the first electrodes, which are located along both sides of the median direction, are located next to each other and are electrically connected to each other.

12 Claims, 10 Drawing Sheets

MULTIDIRECTIONAL SWITCH MEMBER AND ELECTRONIC DEVICE HAVING SAME

CROSS REFERENCE

The present application is related to, claims priority from and incorporates by reference Japanese patent application number 2009-231250, filed on Oct. 5, 2009.

TECHNICAL FIELD

The present application relates to a multidirectional switch member in which multidirectional operation is possible, and to an electronic device that has the multidirectional switch member.

RELATED ART

An input device in which an input can be recognized by detecting a pressing operation when a user pushes a button of an operation panel has been mounted on in-vehicle equipment, multifunctional land-line phones, mobile phones, and so on. One type of input device discussed above performs different functions in accordance with a degree of the pressing of the button rather than just performing on and off functions. As a configuration for performing the different functions, the following has been known: a contact portion is a conductive member that is made of a conductive rubber in a semispherical shape; and the conductive member is located at the back side of an operating plate under the condition in which a curved bottom portion of the conductive member faces a group of contact electrodes on a printed-circuit board (PCB). The configuration discussed above is shown in, for example, Japanese laid-open patent publication number JP 2003-083819.

When the contact portion that is made of the conductive rubber is used, a contact area between the conductive member (conductive rubber) and the group of contact electrodes can be changed in accordance with the degree of the pressing of the button. As a result, a degree of electrical resistance values between the electrodes that configure the group of contact electrodes can depend on the degree of the pressing of the button. Therefore, when the button is configured with a multidirectional switch member that can be operated in four directions, left, right, up and down, each function for the degree of the pressing is realized in each direction.

The multidirectional switch member discussed above has the following problems. When the size of the multidirectional switch member is approximately thumb-sized, it often occurs that an adjacent directional key is also simultaneously pressed at the time of pressing the multidirectional switch member in a certain direction. Specifically, there are the following possibilities in the multidirectional switch member that can be pressed not only in four directions, left, right, up and down, but also in oblique directions. When an operator intends to press an up direction key, the operator may press an oblique up-right direction key at the same time. Alternatively, when an operator intends to press an oblique up-right direction key, the operator may press an up direction key and a right direction key at the same time. Therefore, although a group of electrodes for detecting on and off conditions of each direction key are formed on a PCB with the number of electrodes that corresponds to the number of direction keys, it cannot fulfill a function for a certain direction key in the case of pressing a plurality of direction keys discussed above.

In order to solve the above problems, the following countermeasure is proposed. In addition to forming a group of a total of eight contact electrodes including four directions, left, right, up and down, and four oblique directions on a PCB, measurement values, such as electrical resistance values or electrical voltage values, are compared. The measurement values are dependent on a degree of pressure at each contact corresponding to each of the contact electrodes so that a direction key that has a maximum pressure is determined as an intended direction key that an operator wants to push. As a result, a function of the intended direction key is realized. However, because the number of direction keys is large, many terminals, which correspond to the number of direction keys, extending from each of the contact electrodes have to be formed for determining a direction key as the intended direction key by comparing the measurement values. Consequently, a large amount of data has to be stored in a memory with a data table format, and so on. As a result, it is necessary to have a complicated wiring configuration on a PCB and a large capacity memory. In other words, because resolution direction pointing accuracy is dependent on the number of contact electrodes, a problem of having a large amount of wiring and data tables occurs if the number of contact electrodes is increased.

There are additional problems. The determination method for the intended direction key based on comparing the measurement values of the contact electrodes in each direction is not sufficient. Because when an operator traces the multidirectional switch member in a circumferential direction, a sensitivity of the detection method for detecting the trace in the circumferential direction is low. For example, in a multidirectional switch member in which an operator can operate in a total of eight directions including four directions, left, right, up and down, and four oblique directions, an "ON" state of a direction key can be detected at 45-degree intervals as a central angle. However, the "ON" state of the direction key cannot be detected at a location in which the central angle is less than the 45-degree interval. Therefore, when the operator traces the multidirectional switch member at more than the 45-degree interval in the circumferential direction, the circumferential operation can be detected. The circumferential operation at a 10-degree or a 20-degree interval as a central angle in an early phase cannot be detected.

SUMMARY

With consideration of the situation described above, the present application is provided. An object of the present application is to provide a multidirectional switch member that has a simple structure and a high direction sensitivity, and an electronic device that has the multidirectional switch member.

One embodiment of a multidirectional switch member according to the present application to achieve the above object is as follows: a multidirectional switch member includes an operation plate in which a pressing operation is performed toward a back side of the operation plate from above in a plurality of directions including four standard directions that extend along two intersecting lines and including a median direction extending between adjacent ones of the four standard directions; a printed-circuit board that is located at the back side of the operation plate and that detects the pressing operation by receiving pressure from the operation plate in any of the plurality of directions; a plurality of conductive bodies that are provided on the back side of the operation plate along the plurality of directions without contacting each other, and that protrude toward the printed-circuit board; a group of standard direction contact electrodes that are formed on the printed-circuit board and that have a first electrode and a first ground potential electrode next to each other and without contacting each other at each of the standard directions; and a group of median direction contact electrodes that are formed on the printed-circuit board and that have two of a second electrode and a second ground potential electrode next to and without contacting each other at the median direction, wherein the two second electrodes and the first electrodes, which are located both sides the median direction, are located next to each other and are electrically connected each other.

Another embodiment of a multidirectional switch member according to the present application is as follows: the four standard directions are arranged at 90-degree intervals, and the median direction is arranged between adjacent ones of the four standard directions so that the pressing operation is performed in eight directions.

Yet other embodiment of a multidirectional switch member according to the present application is as follows: the group of the median direction contact electrodes is configured by locating the first electrode with a multi-tooth shape and the first ground potential electrode with a multi-tooth shape opposite each other so as to alternate with each other.

Yet other embodiment of a multidirectional switch member according to the present application is as follows: the group of the standard direction contact electrodes is configured by locating the two second electrodes with a multi-tooth shape and the second ground potential electrode with a multi-tooth shape opposite each other so as to alternate with each other.

Furthermore another embodiment of an electronic device according to the present application is as follows: an electronic device includes a multidirectional switch member in which a pressing operation is performed in a plurality of directions including four standard directions that extend along two intersecting lines and including a median direction extending between adjacent ones of the four standard directions; an operation plate that is pressed toward a back side of the operation plate and that is provided in an upper portion of the multidirectional switch member; a printed-circuit board that is located at the back side of the operation plate and that detects the pressing operation by receiving pressure from the operation plate in any of the plurality of directions; a plurality of conductive bodies that are provided on the back side of the operation plate along the plurality of directions without contacting each other, and that are protruded toward the printed-circuit board; a group of standard direction contact electrodes that are formed on the printed-circuit board and that have a first electrode and a first ground potential electrode next to and without contacting each other at each of the standard directions; and a group of median direction contact electrodes that are formed on the printed-circuit board and that have two of a second electrode and a second ground potential electrode next to and without contacting each other at the median direction; a control unit that determines a direction of the pressing operation and that is provided inside or outside the multidirectional switch member; a measurement part that is provided in the control unit and that measures a measurement value that is changed in accordance with the degree of electrical contact between the first electrode located in the standard direction and the second electrode that is connected to the first electrode, and the first and second ground potential electrodes through the conductive bodies; a vector generation part that is provided in the control unit and that generates vectors in each of the standard directions based on the measurement value or the numerical value, which is linked to the measurement value, and the standard directions that have each of the measurement values or the numerical value; a resultant vector generation part that is provided in the control unit and that generates a resultant vector by synthesizing the vectors; and a pressing operation direction determination part is provided in the control unit and that determines an operation direction based on the resultant vector, wherein the two second electrodes and the first electrodes, which are located both sides the median direction, are located next to each other and are electrically connected each other.

Another embodiment of an electronic device according to the present application is as follows: the measurement value includes an electrical resistance value, a voltage value or a current value.

Yet another embodiment of an electronic device according to the present application is as follows: the vector generation part generates the vector of one of the two opposite standard directions by compensating for the measurement values or the numerical values between the two opposite standard directions.

According to the present application, a multidirectional switch member that has a simple structure and a high detection sensitivity, and an electronic device that has the multidirectional switch member can be provided.

DETAILED DESCRIPTION

Hereinafter, preferred embodiments of a multidirectional switch member and an electronic device that includes the multidirectional switch member according to the present application will be explained with reference to drawings. A mobile phone is explained as an example of an electronic device in the following embodiments. However, the embodiments are not limited to this example. The electronic device can be a device other than a mobile phone, for example, a mobile computer, mobile audio equipment (such as a digital music player, an MP3 player), a portable TV, car audio equipment, and a remote controller for each of the foregoing devices.

1. Configuration of Multidirectional Switch Member

Figure 1:
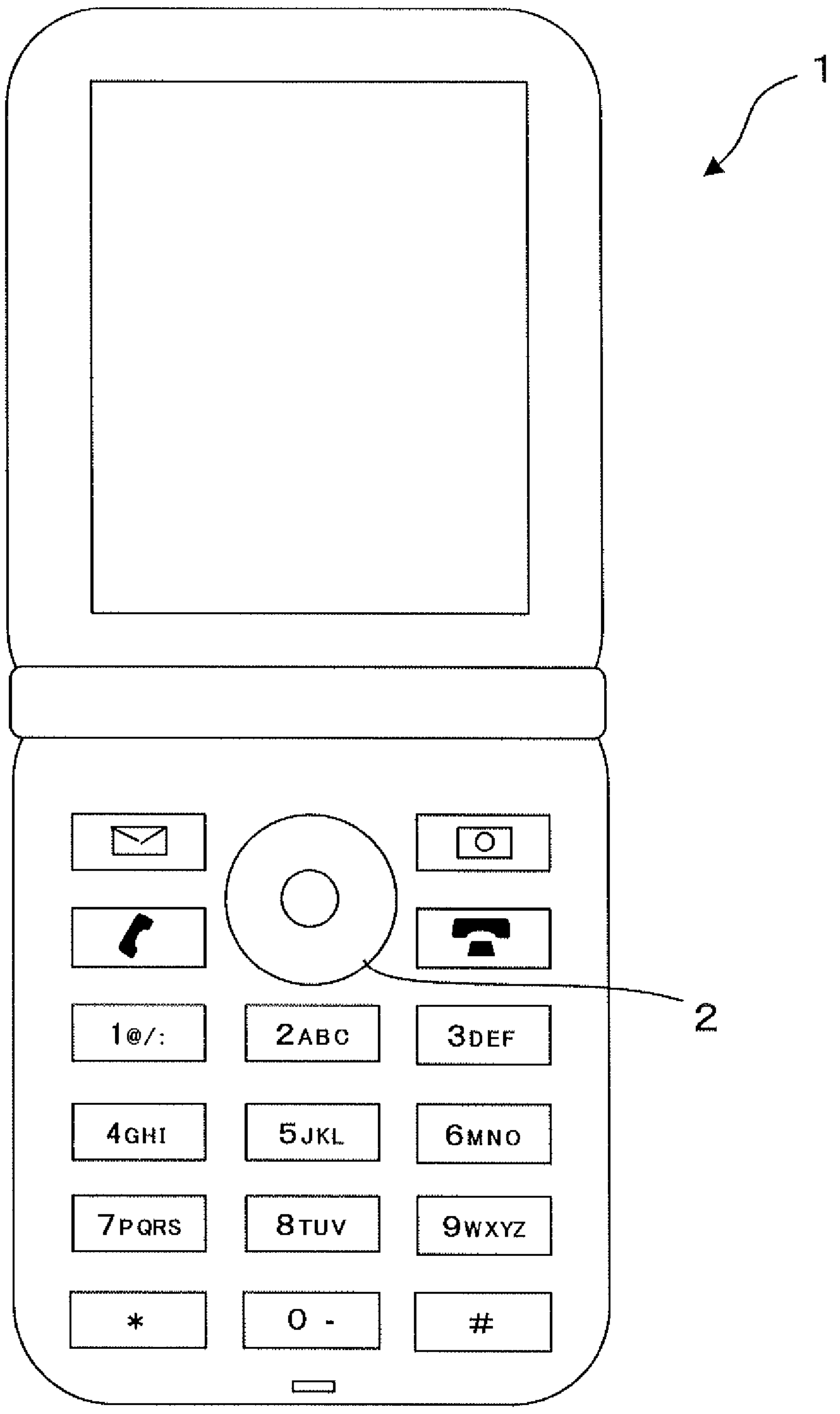
FIG. 1 is a front view of a mobile phone that has a multidirectional switch member according to an embodiment of the present application.

FIG. 1 is a front view of a mobile phone that has a multidirectional switch member according to an embodiment of the present application.

As shown in FIG. 1, a mobile phone 1 as an example of an electronic device according to an embodiment of the present application has a multidirectional switch member 2 that can be operated in multiple directions. The multidirectional switch member 2 can be pressed in eight directions including four standard directions that are defined along two intersecting lines, and four median directions extending between adjacent ones of the four standard directions. The multidirectional switch member 2 is a nearly circular key. The multidirectional switch member 2 can be pressed as an input not only in eight directions from its center, but also at a center portion. However, as an alternative example, the multidirectional switch member 2 can be pressed as an input only in eight directions from its center and not at a center portion. Further, the multidirectional switch member 2 may be configured with a structure in which a key is pressed in five through seven directions including the four standard directions and one through three of the median directions.

Figure 2:
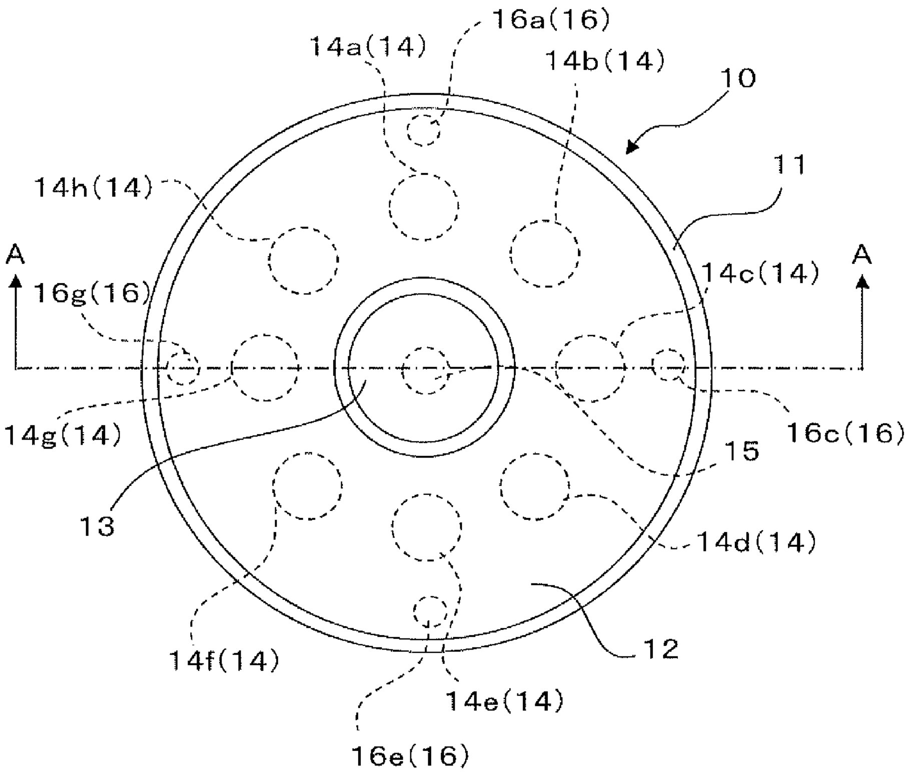
FIG. 2 is a perspective view of a front side portion of a multidirectional switch member of FIG. 1 from above after the front side portion of the multidirectional switch member is uncoupled.
Figure 3:
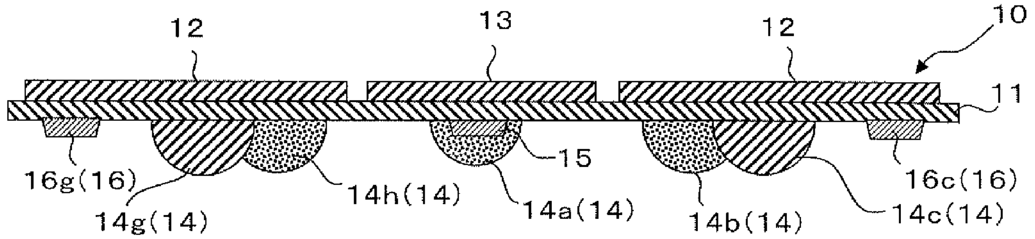
FIG. 3 is a sectional view of a front side portion of a multidirectional switch member taken along line A-A shown in FIG. 2.

FIG. 2 is a perspective view of a front side portion of the multidirectional switch member 2 of FIG. 1 from above after the front side portion of the multidirectional switch member 2 is uncoupled. FIG. 3 is a sectional view of the front side portion of the multidirectional switch member 2 taken along line A-A shown in FIG. 2.

The multidirectional switch member 2 has an operation plate 10 located on a PCB that is provided in the back side. The operation plate 10 is configured with a thin resin sheet 11 with a nearly circular disc shape, a first operation plate 12 with an annular ring shape that is made of resin and that is fixed on the resin sheet 11, and a second operation plate 13 with a circular shape that is made of resin and that is fixed to a nearly center hole portion of the first operation plate 12 on the resin sheet 11. Because a gap is provided between the first operation plate 12 and the second operation plate 13, the first operation plate 12 and the second operation plate 13 are easy to operate independently.

As shown in FIG. 2, eight contact elastic bodies 14*a*-14*h* (hereinafter generally referred to as contact elastic body(ies) 14), as an example of a conductive body, are fixed by arranging the bodies relative to each other at 45-degree intervals relative to the center of the first operation plate 12 and along a circumferential direction of the first operation plate 12 on the back side of the resin sheet. As shown in FIG. 3, the contact elastic bodies 14 are nearly hemispherical in shape and are fixed to the resin sheet 11 so that tips of spherical surfaces of the contact elastic bodies 14 face toward the PCB. One pusher 15 with a nearly circular cylindrical shape is fixed to a region that corresponds to a back side of the second operation plate 13 in a back surface of the resin sheet 11. Each of the pushers 16*a*, 16*c*, 16*e* and 16*g* (hereinafter generally referred to as pusher(s) 16) with a nearly circular cylindrical shape is fixed to a location outside of each of the contact elastic bodies 14*a*, 14*c*, 14*e* and 14*g* in a radial direction, respectively, that corresponds to a back side of the first operation plate 12 in a back surface of the resin sheet 11. The pushers 15 and 16 are, for example, made of resin. A height of the pushers 15 and 16 in the front and back direction of the multidirectional switch member 2 is lower than that of the contact elastic bodies 14. This is because metal domes (discussed later) to which the pushers are contacted are protruded more toward the operation plate 10 than a group of electrodes (discussed later) to which the contact elastic bodies 14 are contacted on the PCB provided opposite to the operation plate 10.

The contact elastic bodies 14 are made of a material with great flexibility so as to enable elastic deformation after the contact elastic bodies 14 contact the PCB. A conductive material is scattered into the contact elastic bodies 14 to have electrical conductivity. A conductive material is, for example, carbon or a metal. It is preferred to use carbon black because it is easy to make with a small particle size (nano-level particle) and easy to handle. Silicone rubber, urethane resin, thermoplastic elastomer (TPE), and natural rubber can each be used as a base material for the contact elastic bodies 14. It is preferred to use silicone rubber among the aforementioned base materials. In view of increasing electrical conductivity and keeping elasticity of the silicone rubber, it is preferred that a mixed quantity of the conductive material is in a range of 5-50% by weight (wt %) with respect to the total quantity of the silicone rubber and the conductive material. It is further preferred that a mixed quantity of the conductive material is in a range of 15-35 wt %.

Figure 4:
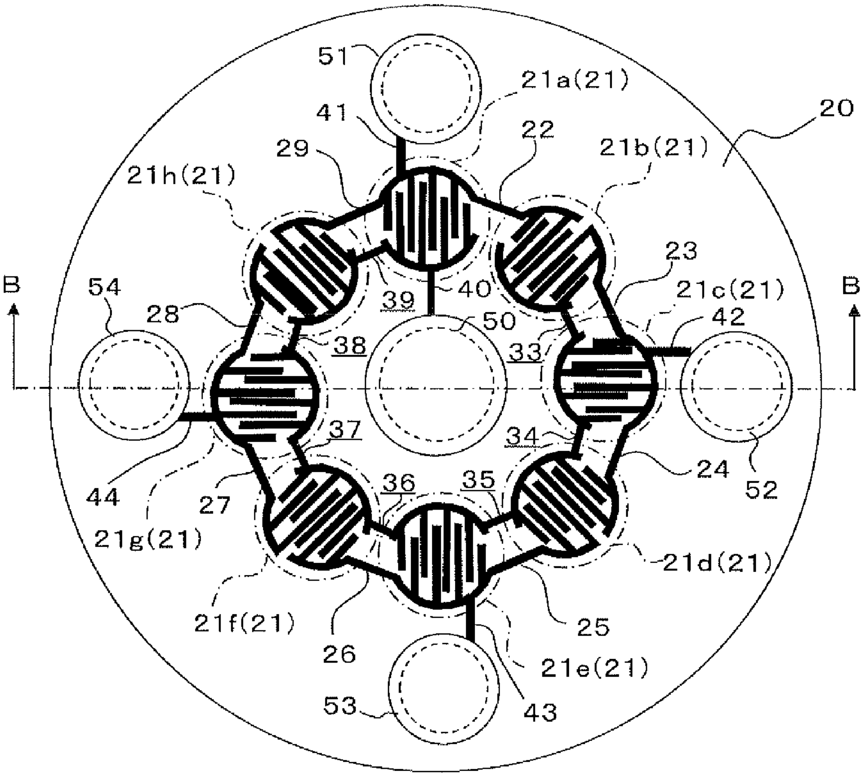
FIG. 4 is a plan view of a PCB that is located at a back side of an operation plate that corresponds to a front side portion of a multidirectional switch member shown in FIG. 1.
Figure 5:
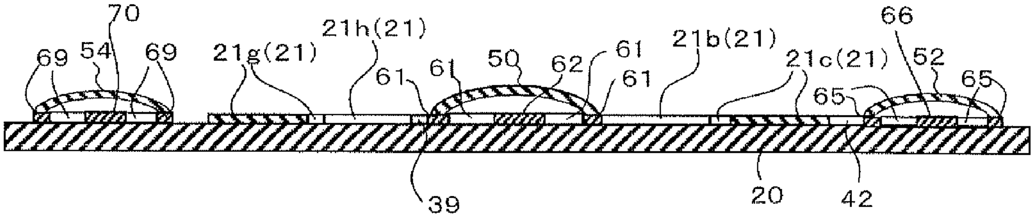
FIG. 5 is a sectional view of a PCB taken along line B-B shown in FIG. 4.

FIG. 4 is a plan view of the PCB that is located at a back side of the operation plate 10 that corresponds to a front side portion of the multidirectional switch member 2 shown in FIG. 1. FIG. 5 is a sectional view of the PCB taken along line B-B shown in FIG. 4. Note that, in FIG. 5, a thickness of wiring or the like that is formed on the PCB is drawn thicker than its actual size.

A PCB 20 shown in FIG. 4 is located opposite to a back side of the operation plate 10 and detects a pressing operation by receiving pressure from the operation plate 10 toward its back side in a certain direction. Groups of multi-tooth electrodes 21*a*-21*h* (hereinafter generally referred to as a group of multi-tooth electrode(s) 21), as an example of groups of contact electrodes, are located on the PCB 20 at the location that corresponds to back sides of the contact elastic bodies 14*a*-14*h*, respectively. The groups of the multi-tooth electrodes 21 are configured by arranging many electrodes into a comb shape with multi-tooth and without contacting each other. The groups of the multi-tooth electrodes 21 are divided into two groups, groups of standard direction contact electrodes 21*a*, 21*c*, 21*e* and 21*g* that are located along four standard directions (here, north, east, south and west), and groups of median direction contact electrodes 21*b*, 21*d*, 21*f* and 21*h* that are located along four median directions (here, northeast, southeast, southwest and northwest) extending between adjacent ones of the four standard directions. When each of the contact elastic bodies 14 contacts each of the multi-tooth electrodes 21 by pressing from above the multi-tooth electrodes 21, a contact area between each of the contact elastic bodies 14 and each of the multi-tooth electrodes 21 widens in accordance with the pressing. As a result, an electrical resistance value between the electrodes of the multi-tooth electrodes 21 becomes smaller. In other words, each of the contact elastic bodies 14 has a variable resistance function to change an electrical resistance value between the electrodes that configure the multi-tooth electrodes 21.

As shown in FIG. 4, wiring 22 connects outsides of the group of the multi-tooth electrodes 21*a* and the group of the multi-tooth electrodes 21*b*. Wiring 23 connects outsides of the group of the multi-tooth electrodes 21*b* and the group of the multi-tooth electrodes 21*c*. Wiring 24 connects outsides of the group of the multi-tooth electrodes 21*c* and the group of the multi-tooth electrodes 21*d*. Wiring 25 connects outsides of the group of the multi-tooth electrodes 21*d* and the group of the multi-tooth electrodes 21*e*. Wiring 26 connects outsides of the group of the multi-tooth electrodes 21*e* and the group of the multi-tooth electrodes 21*f*. Wiring 27 connects outsides of the group of the multi-tooth electrodes 21*f* and the group of the multi-tooth electrodes 21*g*. Wiring 28 connects outsides of the group of the multi-tooth electrodes 21*g* and the group of the multi-tooth electrodes 21*h*. Wiring 29 connects outsides of the group of the multi-tooth electrodes 21*h* and the group of the multi-tooth electrodes 21*a*. Also, wiring 33 connects insides of the group of the multi-tooth electrodes 21*b* and the group of the multi-tooth electrodes 21*c*. Wiring 34 connects insides of the group of the multi-tooth electrodes 21*c* and the group of the multi-tooth electrodes 21*d*. Wiring 35 connects insides of the group of the multi-tooth electrodes 21*d* and the group of the multi-tooth electrodes 21*e*. Wiring 36 connects insides of the group of the multi-tooth electrodes 21*e* and the group of the multi-tooth electrodes 21*f*. Wiring 37 connects insides of the group of the multi-tooth electrodes 21*f* and the group of the multi-tooth electrodes 21*g*. Wiring 38 connects insides of the group of the multi-tooth electrodes 21*g* and the group of the multi-tooth electrodes 21*b*. Wiring 39 connects insides of the group of the multi-tooth electrodes 21*h* and the group of the multi-tooth electrodes 21*a*.

One metal dome 50 is located at the center of an area surrounded by the groups of the multi-tooth electrodes 21 and below the pusher 15. As shown in FIG. 5, a location of an upper surface of the metal dome 50 is higher than that of the groups of the multi-tooth electrodes 21. An outer circumference edge surface of the metal dome 50 is electrically connected to a ground potential electrode 61 that has an annular ring shape and that is formed on the PCB 20. A circular electrode 62 is located inside the ground potential electrode 61 without contacting both the ground potential electrode 61 and the metal dome 50. When the multidirectional switch member 2 is pressed above the second operation plate 13, the pusher 15 is pressed downwardly so that the metal dome 50 can be depressed. As a result, since the central portion of the metal dome 50 contacts the electrode 62, the ground potential electrode 61 is electrically connected to the electrode 62. The inside of the group of the multi-tooth electrodes 21*a* is connected to the ground potential electrode 61 through wiring 40.

Each of metal domes 51-54 is located outside the groups of the multi-tooth electrodes 21*a*, 21*c*, 21*e* and 21*g*, which are provided on the PCB 20, and below each of the pushers 16*a*, 16*c*, 16*e* and 16*g*, respectively. Locations of upper surfaces of the metal domes 51-54 are higher than that of the groups of the multi-tooth electrodes 21 in the same manner of the metal dome 50 discussed earlier. Each of outer circumference edge surfaces of the metal domes 51-54 is electrically connected to annular ring electrodes (discussed later) that have an annular ring shape and are formed on the PCB 20. Circular ground potential electrodes (discussed later) are located inside the annular ring electrodes without contacting both the annular ring electrodes and the metal domes 51-54, respectively. When the multidirectional switch member 2 is pressed above the first operation plate 12, which is located above the pushers 16*a*, 16*c*, 16*e* and 16*g*, the pushers 16*a*, 16*e*, 16*e* and 16*g* are pressed downwardly so that the metal domes 51-54 can be depressed. As a result, since each of the central portions of the metal domes 51-54 contacts each of the ground potential electrodes, which are located just below the metal domes 51-54, the ground potential electrodes are electrically connected to the annular ring electrodes. Each of the annular ring electrodes is connected to each outside electrode of the groups of the multi-tooth electrodes 21*a*, 21*c*, 21*e* and 21*g* through wiring 41-44, respectively. Note that other kinds of mechanical switches, such as an embossed switch that is made of resin (for example, a PET dome) and a tact switch, may be used as substitute for the metal domes 50-54. And, mechanical switches that are similar to the metal domes 50-54 can be formed on the side of the resin sheet 11.

Figure 6:
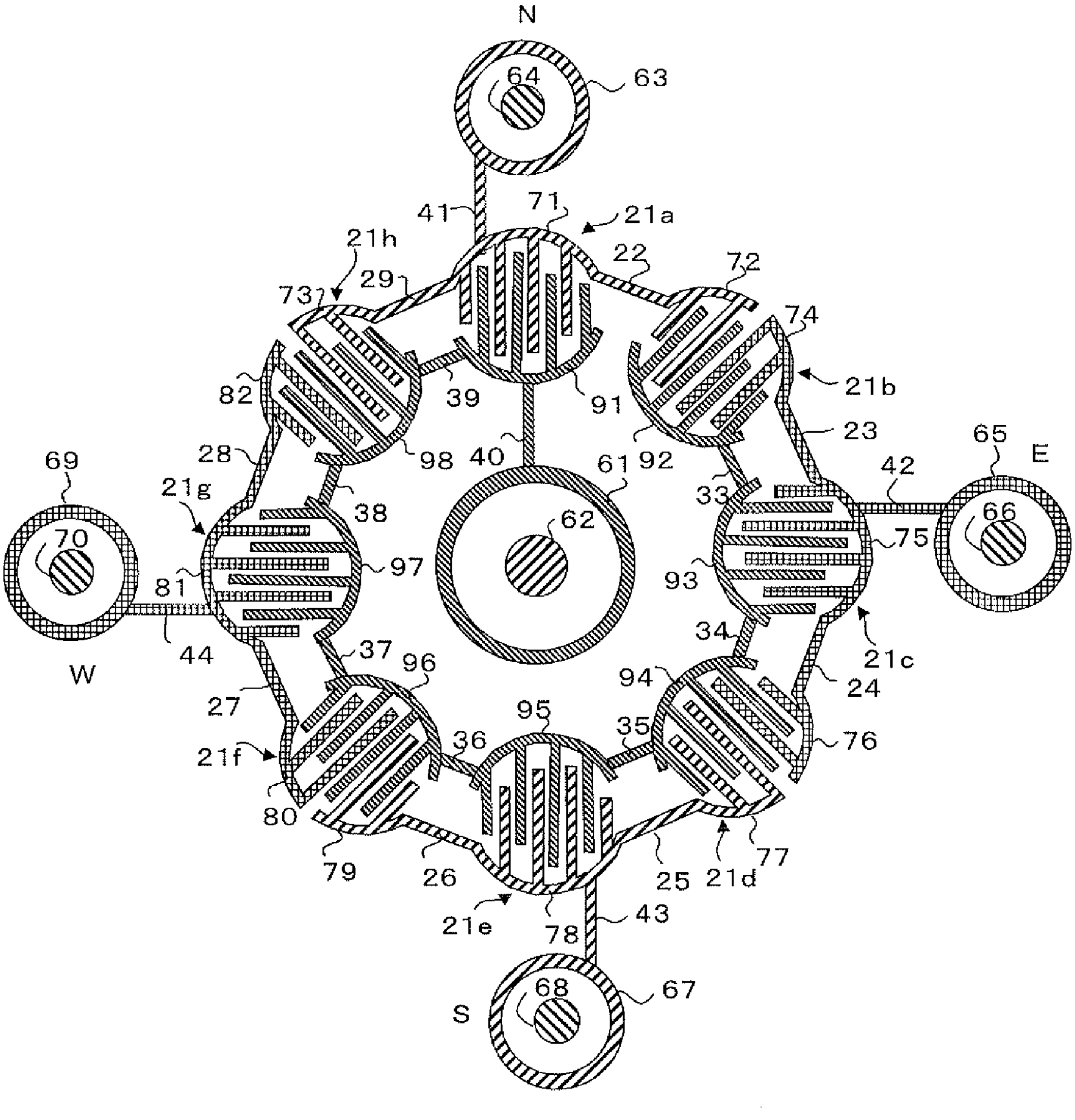
FIG. 6 is a plan view for showing a group of contact electrodes and wiring that are formed on a PCB.

FIG. 6 is a plan view for showing the groups of contact electrodes 21 and wiring that are formed on a PCB.

Configuration of the groups of multi-tooth electrodes 21 shown in FIG. 6 is primarily explained. The group of multi-tooth electrodes 21*a*, which is one of the groups of standard direction contact electrodes, is configured with a multi-tooth electrode 71 as a first electrode that is located at an outside area seen from the center (hereinafter simply referred to as "outside") surrounded by the eight groups of multi-tooth electrodes 21 (an area of the electrode 62), and a multi-tooth electrode 91 as a ground potential electrode that is located at an inside area seen from the electrode 62 (hereinafter simply referred to as "inside"). The multi-tooth electrode 71 and the multi-tooth electrode 91 are located opposite each other so as to alternate with each other. The group of multi-tooth electrodes 21*b*, which is one of the groups of median direction contact electrodes, is configured with a half multi-tooth electrode 72 as a second electrode that is located at the outside and a side close to the group of the multi-tooth electrodes 21*a*, a half multi-tooth electrode 74 as a second electrode that is also located at the outside and a side close to the group of the multi-tooth electrodes 21*c*, and a multi-tooth electrode 92 as a ground potential electrode that is located at the inside from the half multi-tooth electrodes 72 and 74. The group of multi-tooth electrodes 21*c*, which is one of the groups of standard direction contact electrodes and that has the same configuration as the group of multi-tooth electrodes 21*a*, is configured with a multi-tooth electrode 75 as a first electrode that is located at the outside and a multi-tooth electrode 93 as a ground potential electrode that is located at the inside. The group of multi-tooth electrodes 21*d*, which is one of the groups of median direction contact electrodes and that has the same configuration as the group of multi-tooth electrodes 21*b*, is configured with a half multi-tooth electrode 76 as a second electrode that is located at the outside and a side close to the group of the multi-tooth electrodes 21*c*, a half multi-tooth electrode 77 as a second electrode that is also located at the outside and a side close to the group of the multi-tooth electrodes 21*e*, and a multi-tooth electrode 94 as a ground potential electrode that is located at the inside from the half multi-tooth electrodes 76 and 77.

The group of multi-tooth electrodes 21*e*, which is one of the groups of standard direction contact electrodes and that has the same configuration as the group of multi-tooth electrodes 21*a*, is configured with a multi-tooth electrode 78 as a first electrode that is located at the outside and a multi-tooth electrode 95 as a ground potential electrode that is located at the inside. The group of multi-tooth electrodes 21*f*, which is one of the groups of median direction contact electrodes and that has the same configuration as the group of multi-tooth electrodes 21*b*, is configured with a half multi-tooth electrode 79 as a second electrode that is located at the outside and a side close to the group of the multi-tooth electrodes 21*e*, a half multi-tooth electrode 80 as a second electrode that is also located at the outside and a side close to the group of the multi-tooth electrodes 21*g*, and a multi-tooth electrode 96 as a ground potential electrode that is located at the inside from the half multi-tooth electrodes 79 and 80. The group of multi-tooth electrodes 21*g*, which is one of the groups of standard direction contact electrodes and that has the same configuration as the group of multi-tooth electrodes 21*a*, is configured with a multi-tooth electrode 81 as a first electrode that is located at the outside and a multi-tooth electrode 97 as a ground potential electrode that is located at the inside. The group of multi-tooth electrodes 21*h*, which is one of the groups of median direction contact electrodes and that has the same configuration as the group of multi-tooth electrodes 21*b*, is configured with a half multi-tooth electrode 82 as a second electrode that is located at the outside and a side close to the group of the multi-tooth electrodes 21*g*, a half multi-tooth electrode 73 as a second electrode that is also located at the outside and a side close to the group of the multi-tooth electrodes 21*a*, and a multi-tooth electrode 98 as a ground potential electrode that is located at the inside from the half multi-tooth electrodes 82 and 73.

As discussed above, four groups of the multi-tooth electrodes 21*a*, 21*e*, 21*e* and 21*g* as the groups of the standard direction contact electrodes have the following configuration. A multi-tooth electrode that is located at the outside and a multi-tooth electrode that is located at the inside are located opposite each other so as to alternate with each other. On the other hand, four groups of the multi-tooth electrodes 21*b*, 21*d*, 21*f* and 21*h* as the groups of the median direction contact electrodes have the following configuration. Two half multi-tooth electrodes that are located at the outside and a multi-tooth electrode that is located at the inside are located opposite each other so as to alternate with each other. The size of the half multi-tooth electrodes 72, 74, 76, 77, 79, 80, 82 and 73 is nearly the same as half of the multi-tooth electrodes 71, 75, 78, 81, 91, 92, 93, 94, 95, 96, 97 and 98, i.e. they are cut in half. As discussed earlier, the wiring 22 connects the multi-tooth electrode 71 with the half multi-tooth electrode 72. The wiring 23 connects the half multi-tooth electrode 74 with the multi-tooth electrode 75. The wiring 24 connects the multi-tooth electrode 75 with the half multi-tooth electrode 76. The wiring 25 connects the half multi-tooth electrode 77 with the multi-tooth electrode 78. The wiring 26 connects the multi-tooth electrode 78 with the half multi-tooth electrode 79. The wiring 27 connects the half multi-tooth electrode 80 with the multi-tooth electrode 81.

The wiring 28 connects the multi-tooth electrode 81 with the half multi-tooth electrode 82. The wiring 29 connects the half multi-tooth electrode 73 with the multi-tooth electrode 71. Similarly, as discussed earlier, the wiring 33 connects the multi-tooth electrode 92 with the multi-tooth electrode 93. The wiring 34 connects the multi-tooth electrode 93 with the multi-tooth electrode 94. The wiring 35 connects the multi-tooth electrode 94 with the multi-tooth electrode 95. The wiring 36 connects the multi-tooth electrode 95 with the multi-tooth electrode 96. The wiring 37 connects the multi-tooth electrode 96 with the multi-tooth electrode 97. The wiring 38 connects the multi-tooth electrode 97 with the multi-tooth electrode 98. The wiring 39 connects the multi-tooth electrode 98 with the multi-tooth electrode 91.

An annular ring electrode 63 and a circular electrode 64 that is provided within an area surrounded by the annular ring electrode 63 are located at the outside of the group of the multi-tooth electrodes 21*a*. The annular ring electrode 63 is electrically connected to the multi-tooth electrode 71 through the wiring 41. Similarly, annular ring electrodes 65, 67 and 69 and circular electrodes 66, 68 and 70 that are provided within areas surrounded by the annular ring electrodes 65, 67 and 69 are located at the outside of the groups of the multi-tooth electrodes 21*c*, 21*e* and 21*g*, respectively. The annular ring electrodes 65, 67 and 69 are electrically connected to the multi-tooth electrodes 75, 78 and 81 through the wiring 42, 43 and 44, respectively.

The half multi-tooth electrode 73, the multi-tooth electrode 71, the half multi-tooth electrode 72 and the annular ring electrode 63 are provided to detect an input for the north direction (N). The half multi-tooth electrode 74, the multi-tooth electrode 75, the half multi-tooth electrode 76 and the annular ring electrode 65 are provided to detect an input for the east direction (E). The half multi-tooth electrode 77, the multi-tooth electrode 78, the half multi-tooth electrode 79 and the annular ring electrode 67 are provided to detect an input for the south direction (S). The half multi-tooth electrode 80, the multi-tooth electrode 81, the half multi-tooth electrode 82 and the annular ring electrode 69 are provided to detect an input for the west direction (W). As discussed above, the median direction contact electrodes within the groups of the contact electrodes 21 on the PCB are configured with electrodes that detect an input of the standard directions, which are located on both sides of the median directions (northeast (NE), southeast (SE), southwest (SW) and northwest (NW)), and are not configured with specialized electrodes that detect only an input of the median directions. The annular ring electrodes 63, 65, 67 and 69 are for detecting an input of, respectively, the north direction, the east direction, the south direction and the west direction. Each of the ground potential electrodes 64, 66, 68 and 70 that are electrically connectable to the annular ring electrodes 63, 65, 67 and 69, respectively, are not connected to the ground potential electrode 61. Therefore, when all the annular ring electrodes 63, 65, 67 and 69 are electrically connected to all the ground potential electrodes 64, 66, 68 and 70, respectively, by pressing down all the metal domes 51-54, another function, which is different from a function at the time of pressing each of the groups of contact electrodes 21, is realized.

2. A Determination Method for an Operation Direction

FIGS. 7-10 are schematic views for explaining a determination method of an operation direction and a contact region of each of groups of contact electrodes when a pressing operation is performed on an operation plate in a certain direction. Note that the annular ring electrodes 63, 65, 67 and 69, the ground potential electrodes 64, 66, 68 and 70, and the wiring 41-44 are not shown in FIGS. 7-10 in order to avoid complication of the drawings.

Figure 7:
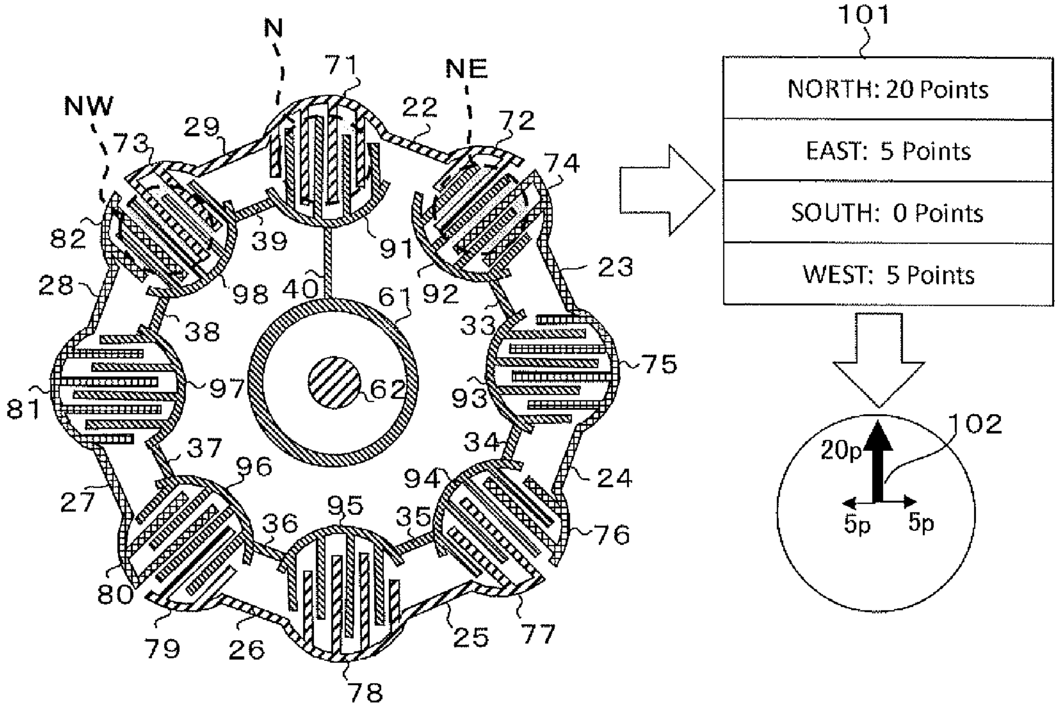
FIG. 7 is a schematic view for explaining a determination method of an operation direction and a contact region of each of groups of contact electrodes when a pressing operation is performed on an operation plate in a certain direction.

As shown in FIG. 7, when the north direction (upper direction of the sheet of FIG. 7) on the first operation plate 12 is pressed toward the PCB 20, the contact elastic bodies 14*a*, 14*b* and 14*h* contact the groups of the contact electrodes at three contact areas N, NE and NW, respectively, on the PCB 20. Here, each of the three contact areas is approximately the same. The contact area N represents a contact area that connects between the multi-tooth electrode 71 and the multi-tooth electrode 91. The contact area NE represents a contact area that connects among the half multi-tooth electrodes 72, 74 and the multi-tooth electrode 92. The contact area NW represents a contact area that connects among the half multi-tooth electrodes 73, 82 and the multi-tooth electrode 98. Because a pressing operation is performed in the north direction, the contact elastic bodies 14 do not contact the groups of the contact electrodes 12 at five directions other than the north, northeast and northwest directions. An electrical resistance value between multi-tooth electrodes (or between a half multi-tooth electrode and a multi-tooth electrode) becomes small inversely relative to a contact area. Therefore, when a certain amount of current flows, a voltage value between multi-tooth electrodes (or between a half multi-tooth electrode and a multi-tooth electrode) becomes small inversely relative to a contact area. A smaller voltage value has a higher point (that corresponds to a value linked to a voltage value, i.e. a measurement value). When 20 points are given to a voltage value of the north direction based on the contact areas N, NE and NW, each of for example, 5 points is given to both voltage values of the east direction based on the contact area NE and the west direction based on the contact area NW. Note that because an electrical resistance value between multi-tooth electrodes (or between a half multi-tooth electrode and a multi-tooth electrode) of the south direction is an infinite value, no points are given. In conclusion, as shown in Table 101, the 20 points are given to the north direction, and the 5 points are given to both the east and west directions. When points that are given to opposite directions are compensated, only the 20 points that are given to the north direction remain. As a result, resultant vector 102 in the north direction is generated so that a pressing operation direction is determined as the north direction.

Figure 8:
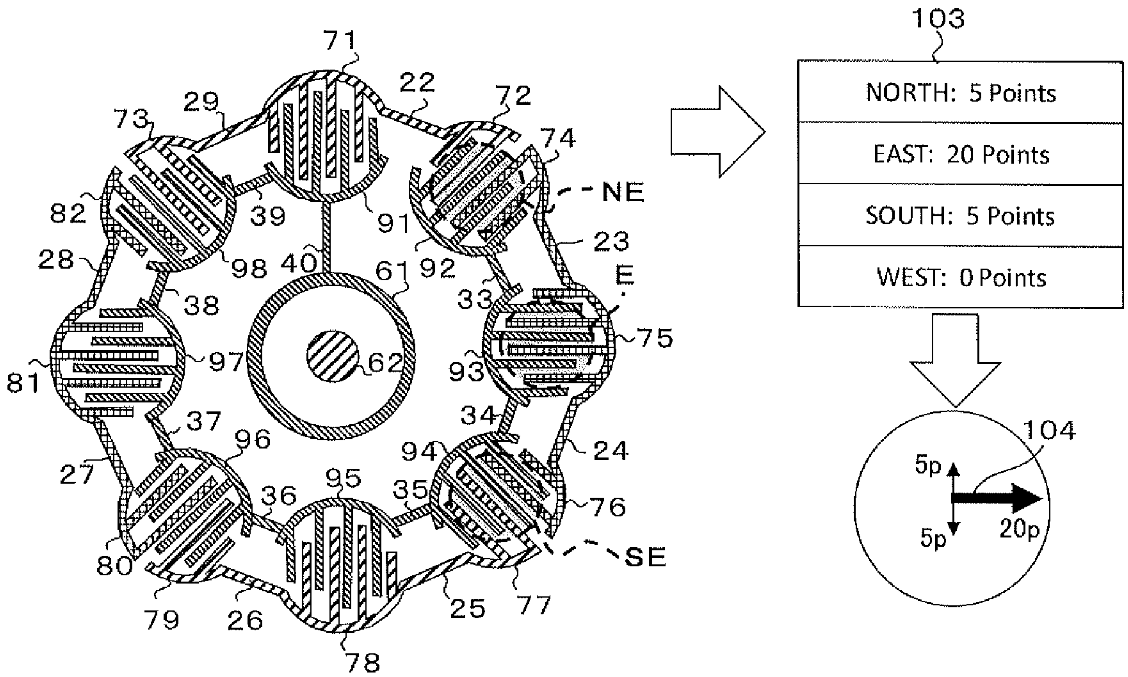
FIG. 8 is a schematic view for explaining a determination method of an operation direction and a contact region of each of groups of contact electrodes when a pressing operation is performed on an operation plate in a certain direction that is different from the direction shown in FIG. 7.

Similarly, in FIG. 8, when the east direction (right direction of the sheet of FIG. 8) on the first operation plate 12 is pressed toward the PCB 20, the contact elastic bodies 14*c*, 14*d* and 14*b* contact the groups of the contact electrodes at three contact areas E, SE and NE, respectively, on the PCB 20. Here, each of the three contact areas is approximately the same. The contact area E represents a contact area that connects between the multi-tooth electrode 75 and the multi-tooth electrode 93. The contact area SE represents a contact area that connects among the half multi-tooth electrodes 76, 77 and the multi-tooth electrode 94. The contact area NE represents a contact area that connects among the half multi-tooth electrodes 72, 74 and the multi-tooth electrode 92. Because a pressing operation is performed in the east direction, the contact elastic bodies 14 do not contact the groups of the contact electrodes 12 at five directions other than the east, southeast and northeast directions. Because an electrical resistance value between multi-tooth electrodes (or between a half multi-tooth electrode and a multi-tooth electrode) of the west direction is an infinite value, no points are given. In conclusion, when points are given in the same manner as an example in FIG. 7, for example, the 20 points are given to the east direction, and the 5 points are given to both the north and south directions, as shown in Table 103. When points that are given to opposite directions are compensated, only the 20 points that are given to the east direction remain. As a result, resultant vector 104 in the east direction is generated so that a pressing operation direction is determined as the east direction.

Figure 9:
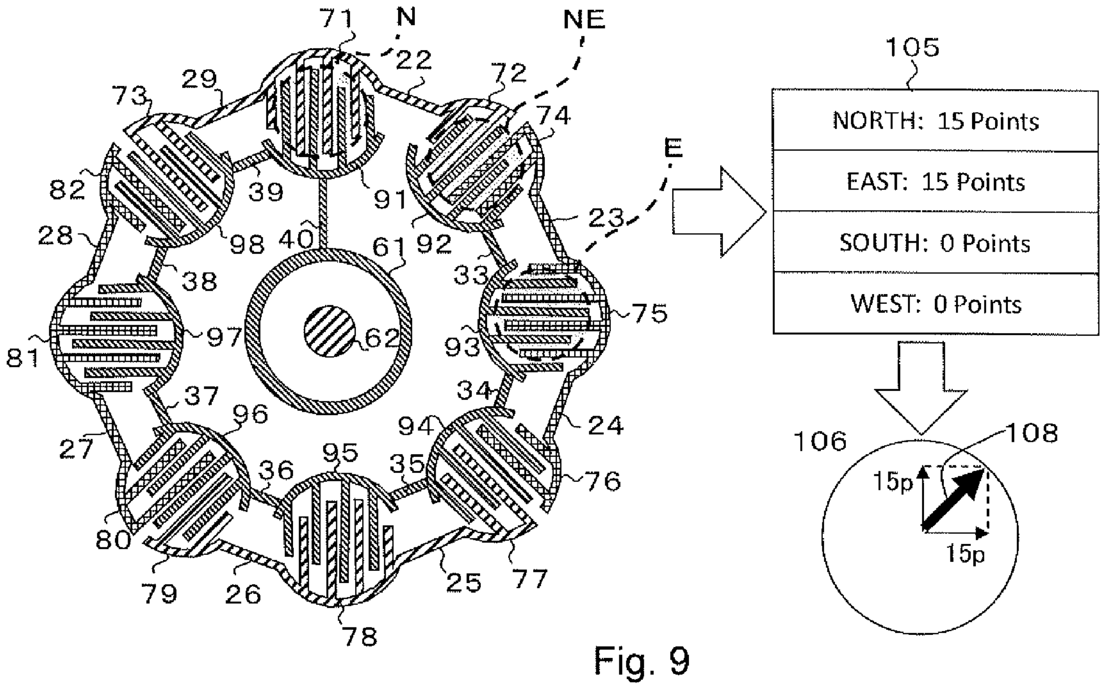
FIG. 9 is a schematic view for explaining a determination method of an operation direction and a contact region of each of groups of contact electrodes when a pressing operation is performed on an operation plate in a certain direction that is different from the directions shown in FIGS. 7 and 8.

Further, as shown in FIG. 9, when the northeast direction (upper-right direction of the sheet of FIG. 9) on the first operation plate 12 is pressed toward the PCB 20, the contact elastic bodies 14*b*, 14*c* and 14*a* contact the groups of the contact electrodes at three contact areas NE, E and N, respectively, on the PCB 20. Here, each of the three contact areas is approximately the same. The contact area NE represents a contact area that connects among the half multi-tooth electrodes 72, 74 and the multi-tooth electrode 92. The contact area E represents a contact area that connects between the multi-tooth electrode 75 and the multi-tooth electrode 93. The contact area N represents a contact area that connects between the multi-tooth electrode 71 and the multi-tooth electrode 91. Since each of entire contact areas for the north direction and the east direction is the same, their voltage values are the same. Further, because a pressing operation is performed in the northeast direction, the contact elastic bodies 14 do not contact the groups of the contact electrodes 12 at five directions other than the northeast, north and east directions. Because electrical resistance values between multi-tooth electrodes (or between a half multi-tooth electrode and a multi-tooth electrode) of the west and the south direction are infinite values, no points are given. In conclusion, for example, the 15 points are given to the north direction, and the 15 points are given to the east direction, as shown in Table 105. The points that are given to the north and the east directions are the same and have no differences. As a result, resultant vector 108 in the northeast direction is generated so that a pressing operation direction is determined as the northeast direction.

Figure 10:
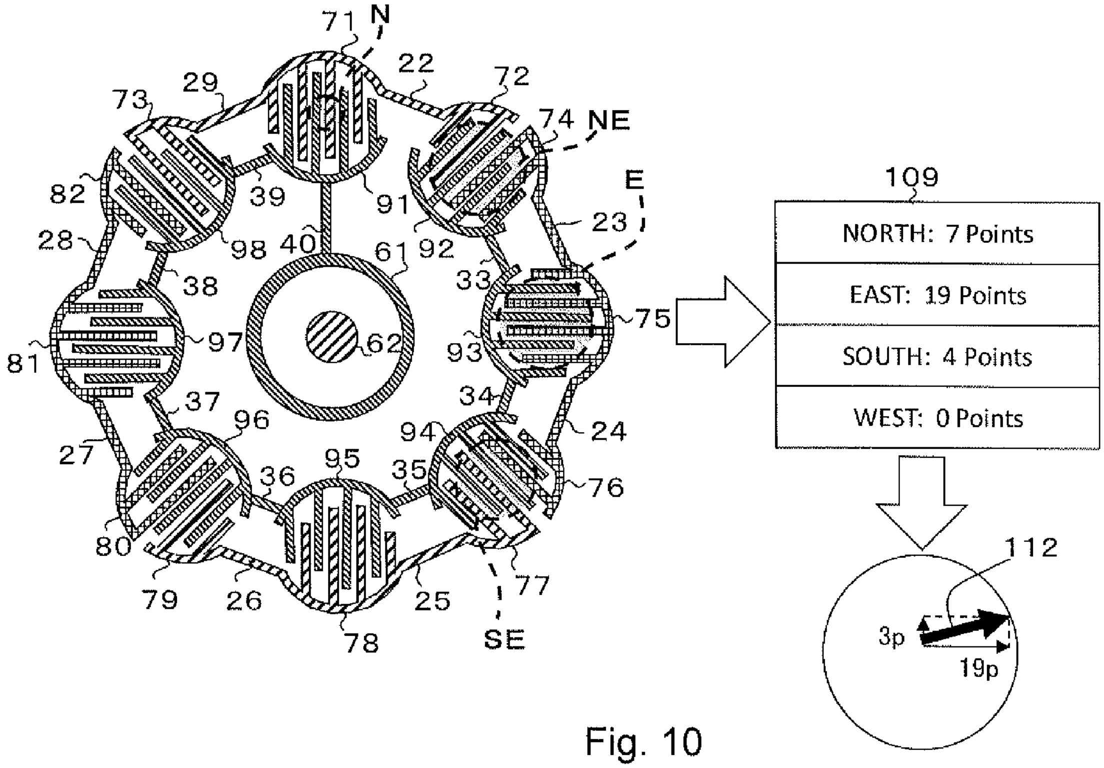
FIG. 10 is a schematic view for explaining a determination method of an operation direction and a contact region of each of groups of contact electrodes when a pressing operation is performed on an operation plate in a certain direction that is different from the directions shown in FIGS. 7, 8 and 9.

Next, as shown in FIG. 10, when the slightly northeast side of the east direction on the first operation plate 12 is pressed toward the PCB 20, a determination method for a pressing operation direction is explained below. The contact elastic bodies 14*b*, 14*c*, 14*d* and 14*a* contact the groups of the contact electrodes at four contact areas NE, E, SE and N, respectively, on the PCB 20. Here, the ratio for each of the four contact areas is 10:10:8:2. Because the pressing operation direction is the slightly northeast side of the east direction, the contact area N that is far from that direction (the slightly northeast side of the east direction) so that an area of the contact area N is smaller than other contact areas NE, E and SE. In this situation, when the 10 points are given to a voltage value between the multi-tooth electrode 75 and the multi-tooth electrode 93, the 10 points also are given to a voltage value between the half multi-tooth electrodes 72, 74 and the multi-tooth electrode 92. The 8 points are given to a voltage value between the half multi-tooth electrodes 76, 77 and the multi-tooth electrode 94. The 2 points are given to a voltage value between the multi-tooth electrode 71 and the multi-tooth electrode 91. Because an electrical resistance value between multi-tooth electrodes (or between a half multi-tooth electrode and a multi-tooth electrode) of the west direction is an infinite value, no points are given. In conclusion, as shown in Table 109, the 7 points are given to the north direction, the 19 points are given to the east direction, and the 4 points are given to the south directions. When points that are given to opposite directions are compensated, only the 19 points that are given to the east direction and the 3 points that are given to the north direction remain. As a result, resultant vector 112 in the slightly northeast side of the east direction is generated so that a pressing operation direction is determined as the slightly northeast side of the east direction.

In the case shown in Table 109, the north and the south directions are opposite directions each other. Therefore, the points given to the north direction and the points given to the south direction are compensated. With respect to the east direction and the west direction, although there are no points given to the west direction, the points for the west direction (zero point) is deducted from the points for the east direction (19 points) in actual calculation.

The direction of the resultant vector 112 is not completely matched with any of the standard directions (north, east, south and west) and the median directions (northeast, southeast, southwest and northwest). The multidirectional switch member 2 can determine any directions and its strength that are not matched with the predetermined eight directions by performing the vector calculations discussed above. One of the benefits is that when an operator traces the first operation plate 12 in the circumferential direction, i.e. performing the circumferential operation, momentary changes in vector can be detected in detail. For example, when an operator traces the first operation plate 12 starting from the true north direction toward east in the circumferential direction, the changes in vector can be detected in the location between the group of the multi-tooth electrodes 21*a* and the group of the multi-tooth electrodes 21*b* without tracing from the group of the multi-tooth electrodes 21*a* to the group of the multi-tooth electrodes 21*b*. Specifically, the circumferential operation in a low-angle stage, such as 10 degrees or 15 degrees from the start, can be determined. Further, for example, when a cursor is moved on a map, the cursor can be moved to any location. As discussed above, because any direction is determined based on the resultant vector, malfunctions and glitches can be prevented compared to the case in which many groups of electrodes are provided.

On the other hand, when a vector, which is not matched with any of the eight directions, is always recognized as the resultant vector 112, an inconvenience occurs at the time of determination of a key for any of the eight directions. Therefore, it is preferred that, in the case other than the circumferential operation discussed above, the location of the resultant vector 112 should be determined, i.e. which area within the eight directions has the resultant vector 112. For example, the first operation plate 12 is divided into eight regions at 45-degree intervals as a central angle. Each of the regions is assigned to north, northeast, east, southeast, south, southwest, west and northwest (eight directions). In this case, since the resultant vector 112 is located in the region for the east direction, the east direction is determined as the operation direction. As discussed above, the operation direction is determined as one of the eight directions in accordance with where the resultant vector that is generated by pressing a plurality of directional keys is located in which region. As a result, an operation other than the circumferential operation is performed with no difficulty and without any problem.

Figure 11:
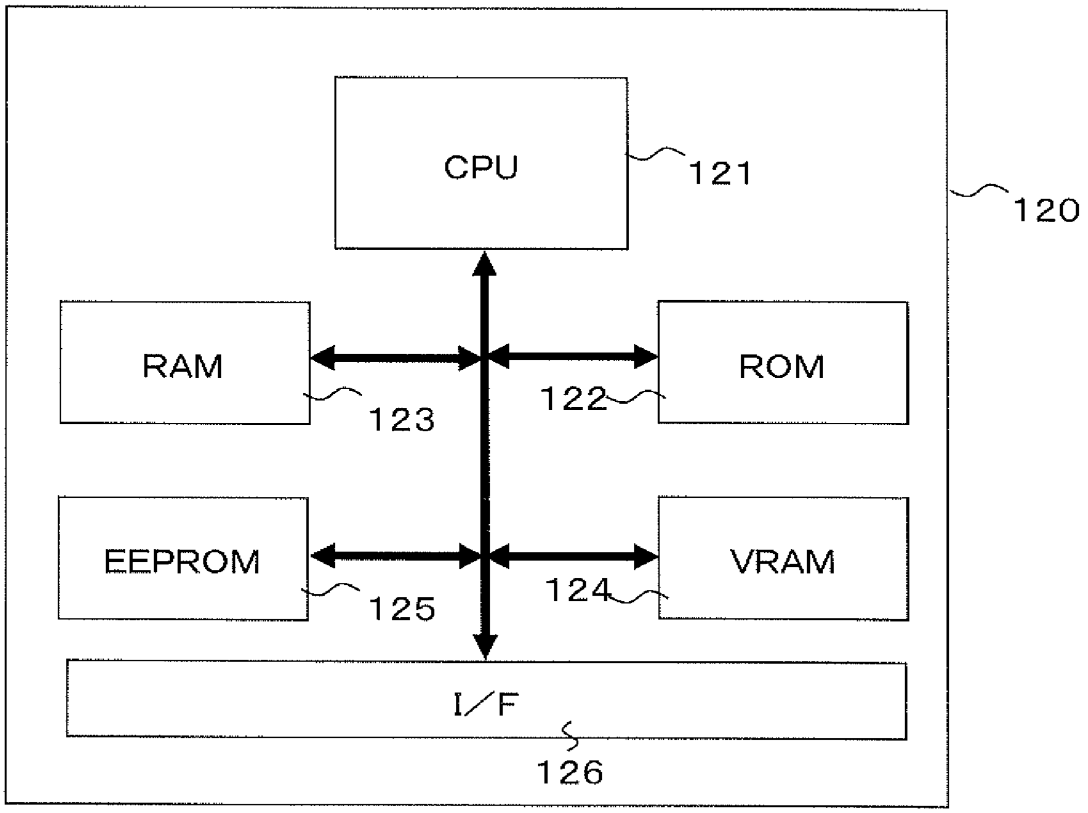
FIG. 11 is a block diagram of an exemplary hardware for a control unit that is provided in an electronic device shown in FIG. 1.

3. Brief Configuration of Control Unit FIG. 11 is a block diagram of an exemplary hardware for a control unit that is provided in an electronic device shown in FIG. 1.

A control unit 120 has functions that determine a pressing operation direction for the multidirectional switch member 2. The control unit 120 is configured with a central processing unit (CPU) 121, a read only memory (ROM) 122, a random access memory (RAM) 123, a video random access memory (VRAM) 124, an electrically erasable and programmable read only memory (EEPROM) 125 and an interface (I/F) 126. The control unit 120 can be provided on the PCB 20 or at anywhere other than the PCB 20 in the multidirectional switch member 2.

The ROM 122 stores read-only information, such as a control program for the CPU 121. The RAM 123 stores an operating system (OS), various application software, a computer program for determining a pressing operation direction according to the present embodiment, and so on. The VRAM 124 temporarily stores display data for displaying various data and information on a display unit of the mobile phone 1. The EEPROM 125 also temporarily stores data. The I/F 126 is for receiving signals from outside the control unit 120 and for sending signals to outside the control unit 120. Note that outside the control unit 120 may include outside the mobile phone 1.

The CPU 121 has the following functions: (1) a measurement part for measuring measurement values, such as an electrical resistance value, a voltage value and a current value, that are changed in accordance with the degree of electrical contact between two groups through each of the contact elastic bodies, i.e. between a group I of the multi-tooth electrodes 71, 75, 78 and 81 as the first electrodes located in the standard directions and the half multi-tooth electrodes (72, 74), (76, 77), (79, 80) and (82, 73) as the second electrodes that are connected to the first electrodes, respectively, and a group 2 of the multi-tooth electrodes 91, 92, 93, 94, 95, 96, 97, and 98 as the ground potential electrodes that are located in the vicinity of the first and second electrodes, respectively, through each of the contact elastic bodies; (2) a vector generation part for generating vectors in each of the standard directions based on the measurement values that are measured by the measurement part or points that are linked to the measurement values, and the standard directions that have each of the measurement values or the points; (3) a resultant vector generation part for generating resultant vectors by synthesizing the vectors generated by the vector generation part; and (4) a pressing operation direction determination part for determining at least an operation direction based on the resultant vectors generated by the resultant vector generation part. The pressing operation direction determination part may determine the degree of the pressing in addition to the operation direction.

A data table or a mathematical expression can be stored in at least one of the ROM 122, the RAM 123 and the EEPROM 125. The data table or the mathematical expression describes the point values that correspond to the electrical resistance values, the voltage values or the current values between, for example, the multi-tooth electrode 71 as the first electrode and the multi-tooth electrode 91 as the ground potential electrode (alternatively, the half multi-tooth electrode 72 as the second electrode and the multi-tooth electrode 92 as the ground potential electrode) when each of the contact elastic bodies 14 contacts each of the groups of the multi-tooth electrodes 21. Note that the "points" should be broadly interpreted so as to include the measurement values itself in addition to numerical values that corresponds to the measurement values of, for example, the voltage values. The points can be in any type of format of the numerical values other than that exemplary shown as Tables 101, 103, 105 and 109 in FIGS. 7-10.

4. Processing Flow for Determining Pressing Operation Direction FIG. 12 is a flow diagram for determining an operation direction when a pressing operation is performed on the multidirectional switch member 2.

When an operator performs a pressing operation in a certain direction of the multidirectional switch member 2, the measurement part of the CPU 121 measures a measurement value, such as a voltage value, of each of the groups of the contact electrodes 21 in each standard direction (ST1). Next, the vector generation part of the CPU 121 generates a vector in each of the standard directions based on the measurement values that are measured by the measurement part or points that are linked to the measurement values, and the standard directions (for example, the north direction and the east direction) that have each of the measurement values or the points (ST2). The resultant vector generation part of the CPU 121 generates resultant vectors by synthesizing the vectors in each of the standard directions generated by the vector generation part (ST3). Then, the pressing operation direction determination part of the CPU 121 determines an operation direction and the degree of the pressing based on the resultant vectors generated by the resultant vector generation part (ST4). Note that only the operation direction may be determined in ST4.

Figure 12:
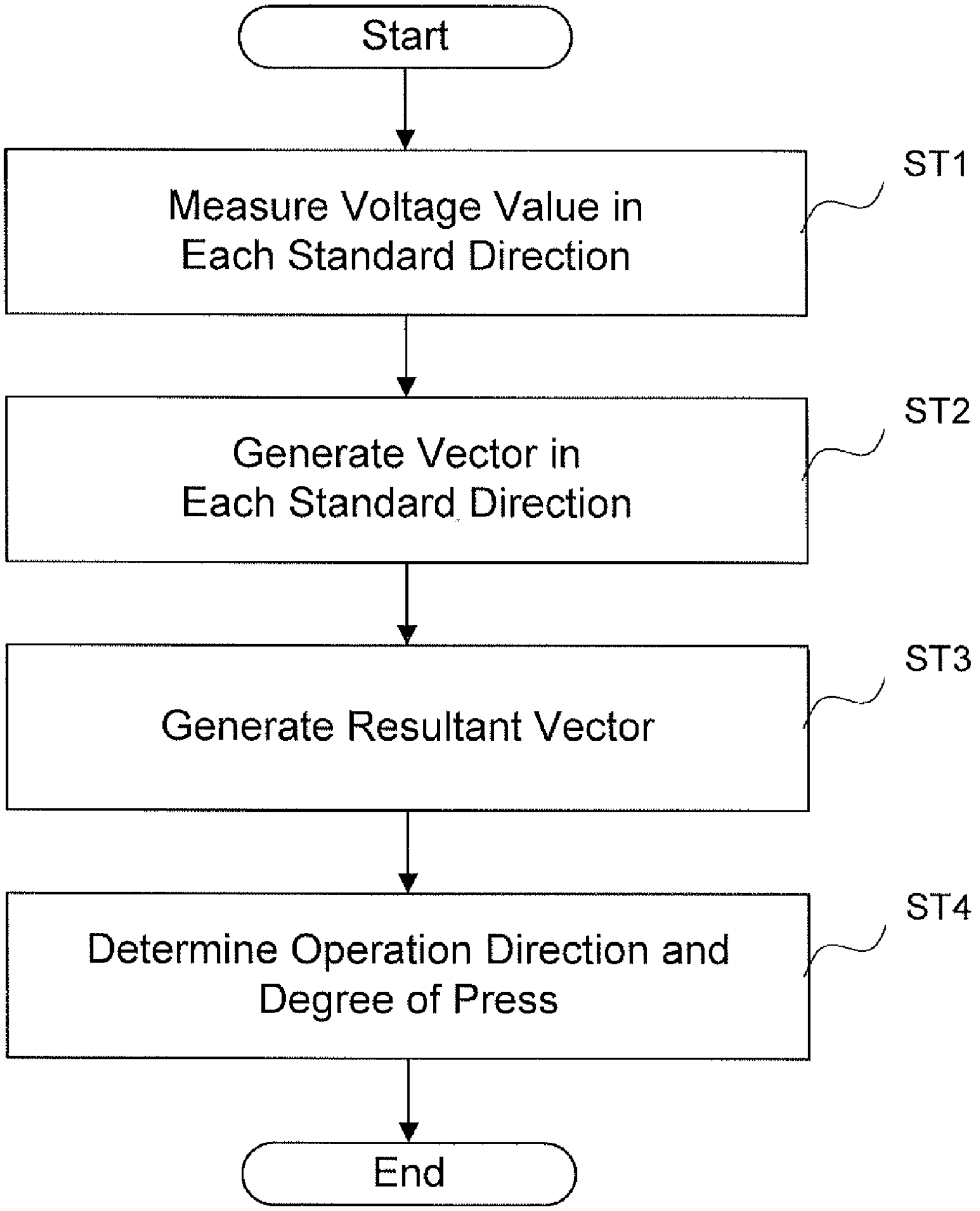
FIG. 12 is a flow diagram for determining an operation direction when a pressing operation is performed on a multidirectional switch member.
Figure 13:
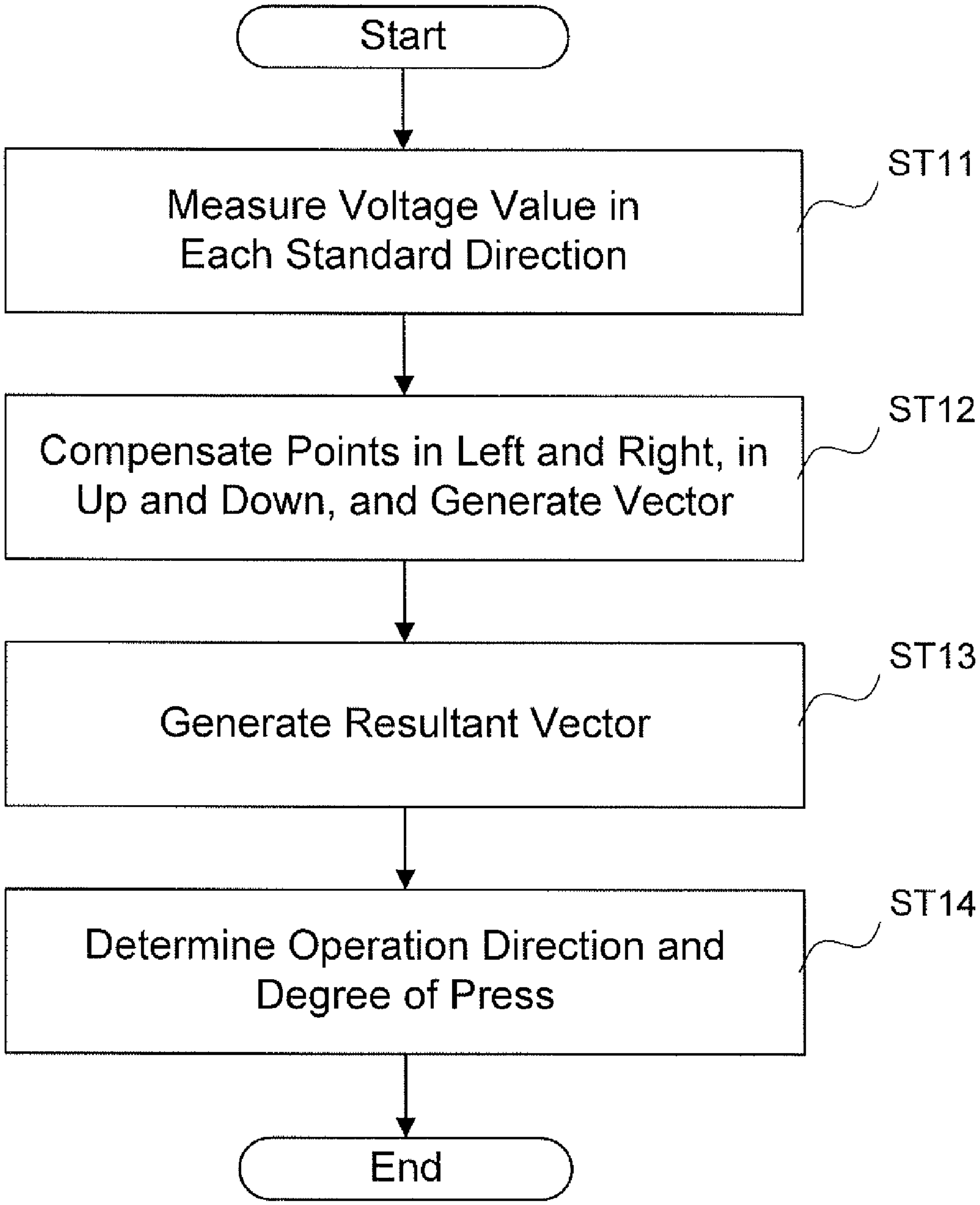
FIG. 13 is an alternative flow diagram for determining an operation direction that is different from one shown in FIG. 12.

FIG. 13 is an alternative flow diagram for determining an operation direction that is different from one shown in FIG. 12 when a pressing operation is performed on the multidirectional switch member 2.

When an operator performs a pressing operation in a certain direction of the multidirectional switch member 2, the measurement part of the CPU 121 measures a measurement value, such as a voltage value, of each of the groups of the contact electrodes 21 in each standard direction (ST11). Next, the vector generation part of the CPU 121 generates a vector of one of two opposite standard directions (such as the north and south directions, and the east and west directions) by compensating for each of the measurement values or points that are linked to the measurement values between the north and south directions (up and down), and between the east and west directions (right and left) when the measurement values exist between the north and south directions opposite to each other and between the east and west directions opposite each other (ST12). The resultant vector generation part of the CPU 121 generates resultant vectors by synthesizing the vectors in each of the standard directions generated by the vector generation part (ST13). Then, the pressing operation direction determination part of the CPU 121 determines an operation direction and the degree of the pressing based on the resultant vectors generated by the resultant vector generation part (ST14). Note that only the operation direction may be determined in ST14.

5. Alternate Examples of Groups of Contact Electrodes and Wiring FIGS. 14A-14C are alternative schematic views of a group of contact electrodes and wiring that are formed on a PCB and are different from ones shown in FIG. 7.

Figure 14A:
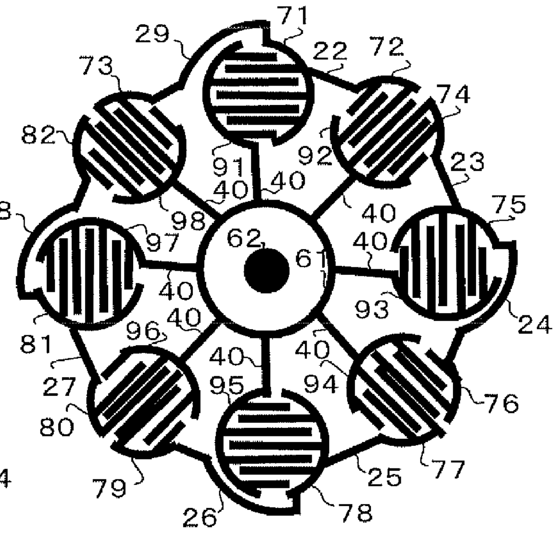
FIGS. 14A-14C are alternative schematic views of a group of contact electrodes and wiring that are formed on a PCB and are different from ones shown in FIG. 7.

Each pair of the multi-tooth electrodes 71 and 91, the multi-tooth electrodes 75 and 93, the multi-tooth electrodes 78 and 95, and the multi-tooth electrodes 81 and 97 is located next to each other in a circumferential direction of a circle that connects each of the groups of the contact electrodes 21 as shown in FIG. 14A. In contract, they are located at both inside and outside from the center of the electrode 62 as shown in FIG. 6. Further each of the multi-tooth electrodes 91-98 is connected to the ground potential electrode 61 through each wiring 40.

Figure 14B:
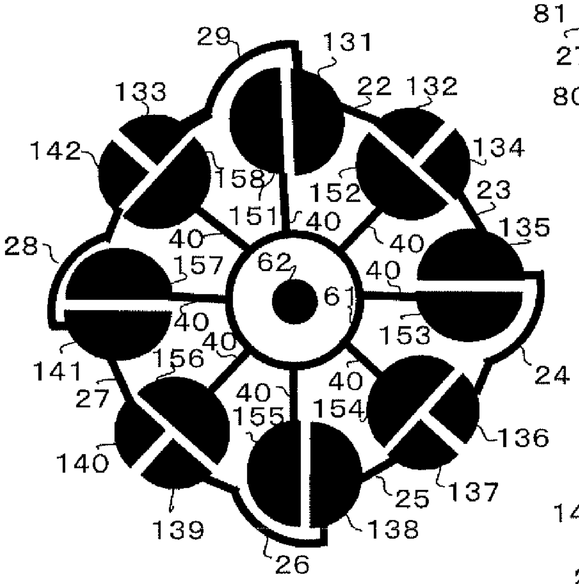
Figure 14C:
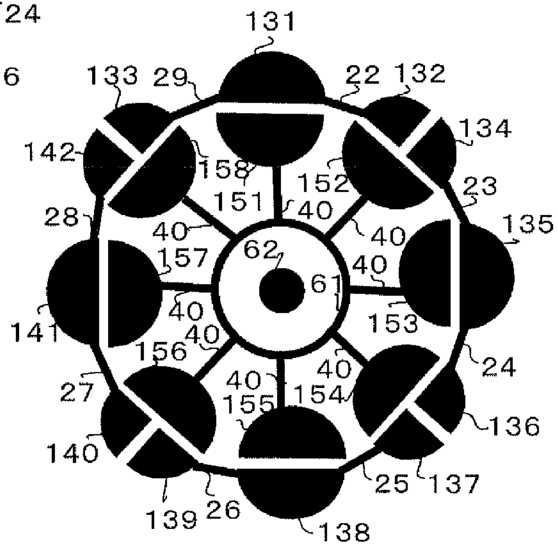

As shown in FIG. 14B, an electrode with a semicircular shape that is made by cutting a circle half or an electrode with a sector shape that is made by cutting a circle quarter can be used instead of using a multi-tooth electrode. Specifically, a group of standard direction contact electrodes for the north direction is formed by arranging a semicircular electrode 131 as the first electrode and a semicircular electrode 151 as the ground potential electrode next to each other along a circumferential direction of a circle that connects each of the groups of the contact electrodes 21. A group of median direction contact electrodes for the northeast direction is formed by arranging sector electrodes 132 and 134 as the second electrodes next to each other along the circumferential direction and by arranging a semicircular electrode 152 as the ground potential electrode inside next to the sector electrodes 132 and 134. A group of standard direction contact electrodes for the east direction is formed by arranging a semicircular electrode 135 as the first electrode and a semicircular electrode 153 as the ground potential electrode next to each other along the circumferential direction. A group of median direction contact electrodes for the southeast direction is formed by arranging sector electrodes 136 and 137 as the second electrodes next to each other along the circumferential direction and by arranging a semicircular electrode 154 as the ground potential electrode inside next to the sector electrodes 136 and 137. A group of standard direction contact electrodes for the south direction is formed by arranging a semicircular electrode 138 as the first electrode and a semicircular electrode 155 as the ground potential electrode next to each other along the circumferential direction. A group of median direction contact electrodes for the southwest direction is formed by arranging sector electrodes 139 and 140 as the second electrodes next to each other along the circumferential direction and by arranging a semicircular electrode 156 as the ground potential electrode inside next to the sector electrodes 139 and 140. A group of standard direction contact electrodes for the west direction is formed by arranging a semicircular electrode 141 as the first electrode and a semicircular electrode 157 as the ground potential electrode next to each other along the circumferential direction. A group of median direction contact electrodes for the northwest direction is formed by arranging sector electrodes 142 and 133 as the second electrodes next to each other along the circumferential direction and by arranging a semicircular electrode 158 as the ground potential electrode inside next to the sector electrodes 142 and 133. As the similar manner described in FIG. 14A, each of the semicircular electrodes 151-158 is connected to the ground potential electrode 61 through each wiring 40.

There is a possibility that the groups of the contact electrodes shown in FIG. 14B have a poor detection sensitivity compared with the groups of the contact electrodes shown in FIG. 14A when the degree of the pressing is small. For example, in the group of the contact electrodes for the north direction, when the contact elastic body 14*a* contacts the right side of the semicircular electrode 131, the contact elastic body 14*a* does not contact the semicircular electrode 151. It is the same situation for other standard directions (the east, the south and the west directions). Therefore, it is relatively preferred to use a configuration for the groups of the contact electrodes shown in FIG. 14A that has the multi-tooth electrodes.

As shown in FIG. 14C, the semicircular electrodes shown in FIG. 14B may be located both inside and outside from the center of the electrode 62 as the groups of the contact electrodes. In this case, there is a possibility that the groups of the contact electrodes shown in FIG. 14C has a poor detection sensitivity compared with the groups of the contact electrodes shown in FIG. 14A when the degree of the pressing is small in the same manner of FIG. 14B. Therefore, it is relatively preferred to use a configuration for the groups of the contact electrodes shown in FIG. 14A that has the multi-tooth electrodes.

6. Other Embodiments

Preferred embodiments of a multidirectional switch member and an electronic device according to the present application are explained. However, the embodiments are not limited to these structures. It will be apparent that the same may be varied in many ways.

For example, the four standard directions that extend along two intersecting lines are not limited to the north, the east, the south and the west directions. Each of four directions of two intersecting lines with a certain orientation other than the 90-degree may be used. The standard directions may be set as the northeast, the southeast, the southwest and the northwest directions, and the median directions may be set as the north, the east, the south and the west directions.

A conductive body may be one common member or a plurality of members for two or more directions without being independent in each direction. The conductive body is not limited to a rubber elastic body such as the contact elastic bodies 14 and may be, for example, a member that is made of a conductive resin or metal (a relatively soft one is preferred).

A pattern of groups of contact electrodes that are configured with multi-tooth electrodes for the first electrodes and the ground potential electrodes that are electrically connected to the first electrodes, and sector electrodes and semicircular electrodes for the second electrodes and the ground potential electrodes that are electrically connected to the second electrodes may be formed on the PCB 20. Alternatively, the first electrodes and the ground potential electrodes that are electrically connected to the first electrodes may be semicircular electrodes, and the second electrodes and the ground potential electrodes that are electrically connected to the second electrodes may be half multi-tooth electrodes and multi-tooth electrodes.

The multidirectional switch member and the electronic device that has the multidirectional switch member being thus described, it will be apparent that the same may be varied in many ways. Such variations are not to be regarded as a departure from the sprit and scope of the invention, and all such modifications as would be apparent to one of ordinary skill in the art are intended to be included within the scope of the following claims.

What is claimed is:

1. A multidirectional switch member comprising:

an operation plate in which a pressing operation is performed toward a back side of the operation plate from above in a plurality of directions including four standard directions that extend along two intersecting lines and including a median direction extending between adjacent ones of the four standard directions;

a printed-circuit board that is located at the back side of the operation plate and that is configured to detect the pressing operation by receiving pressure from the operation plate in any of the plurality of directions;

a plurality of conductive bodies that are provided on the back side of the operation plate along the plurality of directions without contacting each other, and that protrude toward the printed-circuit board;

a group of standard direction contact electrodes that are formed on the printed-circuit board and that each have a first electrode and a first ground potential electrode next to each other and without contacting each other along each of the standard directions; and a group of median direction contact electrodes that are formed on the printed-circuit board and that each have two second electrodes and a second ground potential electrode, the two second electrodes and the second ground potential electrode being configured with a multi-tooth shape next to each other and without contacting each other along the median direction, wherein one of the two second electrodes of one of the group of median direction contact electrodes, one of the two second electrodes of another of the group of median direction contact electrodes, and the first electrode are located next to and spaced apart from each other and are electrically connected to each other by wiring, and each tooth of the two second electrodes of the one of the group of median direction contact electrodes and each tooth of the second ground potential electrode of the one of the group of median direction contact electrodes are provided opposite to each other so as to alternate with each other.

2. The multidirectional switch member according to claim 1, wherein the four standard directions are arranged at 90-degree intervals, and the median direction is arranged between adjacent ones of the four standard directions so that the pressing operation may be performed in eight directions.

3. The multidirectional switch member according to claim 2, wherein the first electrode is configured with a multi-tooth shape and the first ground potential electrode is configured with a multi-tooth shape, and each tooth of the first electrode of one of the group of standard direction contact electrodes and each tooth of the first ground potential electrode of the one of the group of standard direction contact electrodes are opposite to each other so as to alternate with each other.

4. The multidirectional switch member according to claim 1, wherein the first electrode is configured with a multi-tooth shape and the first ground potential electrode is configured with a multi-tooth shape, and each tooth of the first electrode of one of the group of standard direction contact electrodes and each tooth of the first ground potential electrode of the one of the group of standard direction contact electrodes are opposite to each other so as to alternate with each other.

5. An electronic device comprising:

a multidirectional switch member in which a pressing operation may be performed in a plurality of directions including four standard directions that extend along two intersecting lines and including a median direction extending between adjacent ones of the four standard directions;

an operation plate that is configured to be pressed toward a back side of the operation plate and that is provided in an upper portion of the multidirectional switch member;

a printed-circuit board that is located at the back side of the operation plate and that is configured to detect the pressing operation by receiving pressure from the operation plate in any of the plurality of directions;

a plurality of conductive bodies that are provided on the back side of the operation plate along the plurality of directions without contacting each other, and that protrude toward the printed-circuit board;

a group of standard direction contact electrodes that are formed on the printed-circuit board and that each have a first electrode and a first ground potential electrode next to each other and without contacting each other along each of the standard directions;

a group of median direction contact electrodes that are formed on the printed-circuit board and that each have two second electrodes and a second ground potential electrode the two second electrodes and the second ground potential electrode being configured with a multi-tooth shape next to each other and without contacting each other along the median direction;

a control unit that determines a direction of the pressing operation and that is provided inside or outside the multidirectional switch member;

a measurement part that is provided in the control unit and that measures a measurement value that is changed in accordance with the degree of electrical contact between the first electrode located in the standard direction and the second electrode that is connected to the first electrode, and the first and second ground potential electrodes through the conductive bodies;

a vector generation part that is provided in the control unit and that generates vectors in each of the standard directions based on the measurement value or a numerical value that is linked to the measurement value, and the standard directions that have each of the measurement values or the numerical value;

a resultant vector generation part that is provided in the control unit and that generates a resultant vector by synthesizing the vectors; and a pressing operation direction determination part is provided in the control unit and that determines an operation direction based on the resultant vector, wherein one of the two second electrodes of one of the group of median direction contact electrodes, one of the two second electrodes of another of the group of median direction contact electrodes, and the first electrode are located next to and spaced apart from each other and are electrically connected each other by wiring, and each tooth of the two second electrodes of the one of the group of median direction contact electrodes and each tooth of the second ground potential electrode of the one of the group of median direction contact electrodes are provided opposite to each other so as to alternate with each other.

6. The electronic device according to claim 5, wherein the measurement value includes an electrical resistance value, a voltage value or a current value.

7. The electronic device according to claim 6, wherein the vector generation part generate the vector of one of the two opposite standard directions by compensating for the measurement values or the numerical values between the two opposite standard directions.

8. The electronic device according to claim 7, wherein the first electrode is configured with a multi-tooth shape and the first ground potential electrode is configured with a multi-tooth shape, and each tooth of the first electrode of one of the group of standard direction contact electrodes and each tooth of the first ground potential electrode of the one of the group of standard direction contact electrodes are opposite to each other so as to alternate with each other.

9. The electronic device according to claim 6, wherein the first electrode is configured with a multi-tooth shape and the first ground potential electrode is configured with a multi-tooth shape, and each tooth of the first electrode of one of the group of standard direction contact electrodes and each tooth of the first ground potential electrode of the one of the group of standard direction contact electrodes are opposite to each other so as to alternate with each other.

10. The electronic device according to claim 5, wherein the vector generation part generates the vector of one of the two opposite standard directions by compensating for the measurement values or the numerical values between the two opposite standard directions.

11. The electronic device according to claim 10, wherein the first electrode is configured with a multi-tooth shape and the first ground potential electrode is configured with a multi-tooth shape, and each tooth of the first electrode of one of the group of standard direction contact electrodes and each tooth of the first ground potential electrode of the one of the group of standard direction contact electrodes are opposite to each other so as to alternate with each other.

12. The electronic device according to claim 5, wherein the first electrode is configured with a multi-tooth shape and the first ground potential electrode is configured with a multi-tooth shape, and each tooth of the first electrode of one of the group of standard direction contact electrodes and each tooth of the first ground potential electrode of the one of the group of standard direction contact electrodes are opposite to each other so as to alternate with each other.

* * * * *